United States Patent
Nazarian

(10) Patent No.: US 7,286,378 B2
(45) Date of Patent: Oct. 23, 2007

(54) SERIAL TRANSISTOR-CELL ARRAY ARCHITECTURE

(75) Inventor: Hagop A. Nazarian, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 10/873,112

(22) Filed: Jun. 23, 2004

(65) Prior Publication Data

US 2005/0105329 A1    May 19, 2005

Related U.S. Application Data

(63) Continuation-in-part of application No. 10/699,652, filed on Nov. 4, 2003, now Pat. No. 7,064,970.

(51) Int. Cl.
*G11C 27/00* (2006.01)

(52) U.S. Cl. .......................................... 365/46; 365/63

(58) Field of Classification Search ................. 365/46, 365/63, 171
See application file for complete search history.

(56) References Cited

U.S. PATENT DOCUMENTS

| | | | |
|---|---|---|---|
| 6,348,365 B1 | 2/2002 | Moore et al. | |
| 6,356,477 B1 | 3/2002 | Tran | |
| 6,358,756 B1 | 3/2002 | Sandhu et al. | |
| 6,445,612 B1 | 9/2002 | Naji | |
| 6,476,753 B1 * | 11/2002 | Hansen et al. | 341/155 |
| 6,693,824 B2 * | 2/2004 | Nahas et al. | 365/158 |
| 6,711,052 B2 * | 3/2004 | Subramanian et al. | 365/158 |
| 6,757,189 B2 | 6/2004 | Hung et al. | |
| 6,839,269 B2 * | 1/2005 | Iwata et al. | 365/158 |
| 6,940,748 B2 * | 9/2005 | Nejad et al. | 365/171 |
| 6,950,334 B2 * | 9/2005 | Shimizu et al. | 365/158 |
| 2001/0012228 A1 | 8/2001 | Perner | |
| 2002/0039308 A1 | 4/2002 | Gogl et al. | |
| 2002/0159317 A1 | 10/2002 | Lammers et al. | |
| 2002/0176272 A1 | 11/2002 | DeBrosse et al. | |
| 2002/0196647 A1 | 12/2002 | Nickel | |
| 2003/0058685 A1 | 3/2003 | Tran et al. | |

FOREIGN PATENT DOCUMENTS

EP    1426 966 A2    9/2004

OTHER PUBLICATIONS

M. Durlam, et al., "A Low Power 1Mbit MRAM based on 1T1MTJ Bit Cell Integrated With Copper Interconnects", 2002 Symposium on VLSI Circuits Digest of Technical Papers; Mar. 2, 2002.

(Continued)

*Primary Examiner*—Michael Tran
(74) *Attorney, Agent, or Firm*—Dickstein Shapiro LLP

(57) ABSTRACT

A memory device having memory cells in which a single access transistor controls the grounding of at least four storage elements, such as resistive storage elements, for purposes of reading the respective logical states of the storage elements. Unique sensing techniques are provided to sense the states of the storage elements. The logical states of the storage elements are decoupled from one another and are read independently.

18 Claims, 14 Drawing Sheets

OTHER PUBLICATIONS

R. Desikan, et al., "On-Chip MRAM as a High-Bandwidth, Low-Latency Replacement for DRAM Physical Memories", Department of Computer Sciences, Tech Report TR-02-47, University of Texas at Austin, Sep. 27, 2002.

James Daughton, Magnetoresistive Random Access Memory (MRAM), Feb. 24, 2000 (contact Arthur at daughton@nic.com).

R. Butner, "Computing Unplugged", http://www.research.ibm.com/thinkresearch/pages/2001/20010202_mram.shtml; visited Apr. 7, 2003.

* cited by examiner

SERIAL TRANSISTOR-CELL ARRAY ARCHITECTURE

This application is a continuation-in-part of application Ser. No. 10/699,652, filed on Nov. 4, 2003, now U.S. Pat. No. 7,064,970 which is herby incorporated by reference in its entirety.

FIELD OF THE INVENTION

The invention relates to memory structures utilizing variable resistance states for data storage and to an architecture for such structures incorporating a serial configuration.

BACKGROUND OF THE INVENTION

Integrated circuit designers have always sought the ideal semiconductor memory: a device that is randomly accessible, can be written or read very quickly, is non-volatile, but indefinitely alterable, and consumes little power. Emerging variable resistance memories increasingly offer these advantages. Programmable Conductance Random Access Memory (PCRAM) is one example of such a memory. Additionally, Magnetoresistive Random Access Memory (MRAM) technology has been increasingly viewed as offering all these advantages. Other types of variable resistance memories include polymer-based memory and chalcogenide-based memory.

A PCRAM element has a structure including a chalcogenide-based glass region incorporating a metal (or metal ions) and electrodes on either side of the glass region. Information can be stored as a digital "1" or "0" as stable resistance states. A typical chalcogenide glass used in PCRAM devices is $Ge_xSe_{100-x}$. The chalcogenide glass can also be used in conjunction with layers of Ag and/or $Ag_2Se$. An example of a PCRAM device is described in U.S. Pat. No. 6,348,365 to Moore and Gilton. The glass region of a PCRAM element can be made less resistive upon application of a threshold voltage. This less resistive state is maintained in a non- or semi-volatile manner and is reversible by applying a reversed voltage. The resistance state of a PCRAM element can be sensed by the application of a sub-threshold voltage through the cell element.

A magnetic memory element has a structure which includes ferromagnetic layers separated by a non-magnetic barrier layer that forms a tunnel junction. An example of an MRAM device is described in U.S. Pat. No. 6,358,756 to Sandhu et al. Information can be stored as a digital "1" or a "0" as directions of magnetization vectors in these ferromagnetic layers. Magnetic vectors in one ferromagnetic layer are magnetically fixed or pinned, while the magnetic vectors of the other ferromagnetic layer are not fixed so that the magnetization direction is free to switch between "parallel" and "antiparallel" states relative to the pinned layer. In response to parallel and antiparallel states, the magnetic memory element represents two different stable resistance states, which are read by the memory circuit as either a "1" or a "0." Passing a current through the MRAM cell enables detection of the resistance states.

As mentioned above, polymer memory, another type of variable resistance memory, utilizes a polymer-based layer having ions dispersed therein or, alternatively, the ions may be in an adjacent layer. The polymer memory element is based on polar conductive polymer molecules. The polymer layer and ions are between two electrodes such that upon application of a voltage or electric field the ions migrate toward the negative electrode, thereby changing the resistivity of the memory cell. This altered resistivity can be sensed as a memory state.

Chalcogenide memory, another type of variable resistance memory, switches resistivity states by undergoing a phase change in response to resistive heating. The two phases corresponding to the two stable resistivity states include a polycrystalline state and an amorphous state. The amorphous state is a higher resistive state, which can be read as stored data.

A problem encountered in variable resistance memory array architectures is the generation of sneak paths. Sneak paths during read operations are most prevalent in crosspoint array architectures, and exist wherever memory cells are in direct electrical contact with one another through the array. A sneak path is a parasitic path or logic flow within a system which, under certain conditions, can initiate an undesired function or inhibit a desired function. Typically, in variable resistance memory circuits the problem is exhibited when reading data from a desired cell. Other cells in electrical contact with the addressed cell provide alternate routes for current, causing a sneak path and lowering the memory circuit's resistance to potentially unreadable levels.

A variable resistance memory array 10, in this example an MRAM array, is shown in FIG. 1a. MRAM cells 12 are located and addressed at the intersecting points of bit lines 16 (also called column lines) and word lines 18 (also called row lines). When the cell 12 to be read is addressed by coupling the word line 18 and forcing a current on the bit line 16, the addressed cell 12 exhibits a resistivity based on its programmed state, which can be sensed by sense circuitry 14 coupled to the bit lines 16 and/or word lines 18. However, parasitic current also flows through other non-addressed cells 12a of the array 10 in multiple sneak paths. These sneak paths reduce the total resistivity of the cell 12 being sensed by the sense circuitry 14. With the diminished resistance there is a smaller margin between the programmed higher and lower resistive states of the memory cell 12, making the memory more difficult to read.

Sneak path equivalent resistance, which is an equivalent resistances of the memory cells of the sneak path, provides an alternate route for current in the array architecture when the selected cell 12 is being sensed. Thus, the sneak path creates an effective parallel current path. To minimize the impact of the sneak path an equal potential voltage VA, which is equal to the sensed bit line voltage VA', is applied to all unselected bit lines 16a, and unselected word lines 18a. Based on the equal potential voltage scheme, FIG. 1b shows the equivalent circuit and resistances between the sensed bit line 16 (e.g., VA'), the forced equal potential VA voltage on the unselected bit lines 16a and word lines 18a, and the grounded word line 18. The resistance R20r between the sensed bit line 16 and unselected bit lines 16a is approximated to be:

$$R\text{sneak1} = R/(r-1), \qquad (1)$$

where R is the average resistance of the MRAM memory cells and r is the total number of word lines 18 or rows in the memory array 10.

The second sneak path resistance R20c is formed through node VA and ground. This resistance is approximated to be:

$$R\text{sneak2} = R/(c-1), \qquad (2)$$

where R is the average resistance of the MRAM memory cells and c is the total number of unselected bit lines 16a or columns in the memory array 10.

Since node VA is forced to a voltage equal to VA', Rsneak2 will not in the path of the sensing current, and the total equivalent resistance looking from the sense amplifier will not be impacted by Rsneak2. Based on this network the resistance that the sense amplifier 14 connected to bit line 16 will see is calculated to be a function of VA, VA', R, and Rsneak1 as follows:

$$Rsense=VA'/(((VA'-VA)/Rsneak1)+VA'/R), \text{ or} \quad (3)$$

$$Rsense=R/(((R(VA'-VA)/(Rsneak1*VA'))+1), \quad (4)$$

where VA' is the voltage applied to bit line 16 (approximately 0.5 v).

If the difference between VA and VA' is zero (VA'−VA), then Rsense=R, which is desired, however due to noise, offsets any difference between VA, and VA' will cause a large reduction in the Rsense value, and the resistance change will be very hard to be sensed.

Noise sensitivity due to the architecture structure and is spread throughout the entire array 10. The resistance change between the two states will result in small input impedance change due to small sneak path resistance, as indicated above. A 20% change in R will result into a very small change in Rsense and will necessitate special biasing circuits as described above (e.g., an equal potential scheme) to increase the Rsense change. For example a 20% resistance change on an average one Mega Ohm resistance and an array with 1000 rows will result in a 1.5% change with 5 mv offset between VA and VA', 5.8% change with 1 mv between VA and VA' and 9.0% change with 0.5 mv between VA and VA'.

Therefore, to sense the selected resistive cell in the presence of a noise sneak path that reduces its equivalent sensed resistance change, a special sensing scheme is also required.

An integration sensing scheme is used to amplify the difference above the noise level and then detect the difference between the high resistance programmed state, and low resistance unprogrammed states of the resistive cell. Accordingly, sneak path resistance makes sensing above the noise level more difficult. Thus, it would be advantageous to have a memory array architecture suitable for a variable resistance memory array that could provide similar integration characteristics as a cross-point array architecture, but which would also mitigate the detriments of sneak path occurrence.

BRIEF SUMMARY OF THE INVENTION

The invention provides a memory array architecture suitable for a variable resistance memory array that could provide similar integration characteristics as a cross-point array architecture, but which would also mitigate the detriments of sneak path occurrence.

Exemplary embodiments of the invention provide a memory device having memory cells in which a single access transistor controls the grounding of at least four storage elements, such as resistive storage elements, for purposes of reading the respective logical states of the storage elements. Unique sensing techniques are provided to sense the states of the storage elements. The logical states of the storage elements are decoupled from one another and are read independently.

BRIEF DESCRIPTION OF THE DRAWINGS

These and other features of the invention will be more clearly understood from the following detailed description of the invention which is provided in connection with the accompanying drawings, in which:

FIG. 1b is a schematic representation of an equivalent circuit of the sneak path occurrence of the prior art array illustrated in FIG. 1a;

FIG. 4b is a schematic representation of a memory array circuit as shown in FIGS. 3 or 4a;

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

This invention relates to a novel array architecture for memory technology, particularly variable resistance memory with low volatility (termed "non-volatile" in the art), requiring little or no refreshing, such as MRAM, PCRAM, polymer memory, and chalcogenide-based memory. It is also possible that the memory array architecture of the invention can be used with other types of memory as well, so long as such memory may benefit from the mitigation of sneak path. Typical memory cell types with which the invention can be utilized are two terminal structures; however, more than two terminals can be used also.

The invention mitigates problems associated with memory array architecture sneak path by limiting the number of memory cells associated (by potential electrical connection) with an addressed cell to a known number having a sneak path resistance that can be calculated and taken into consideration when sensing the addressed memory cell. Blocks of memory cells are associated with access transistors, which separate the memory cells associated with the transistor into one-half (½) sections of cell blocks. The access transistors can be associated with n memory cells, where n is at least 2. The one-half sections need not necessarily be symmetrical or consist of equal numbers of memory cells.

Figure 2A:
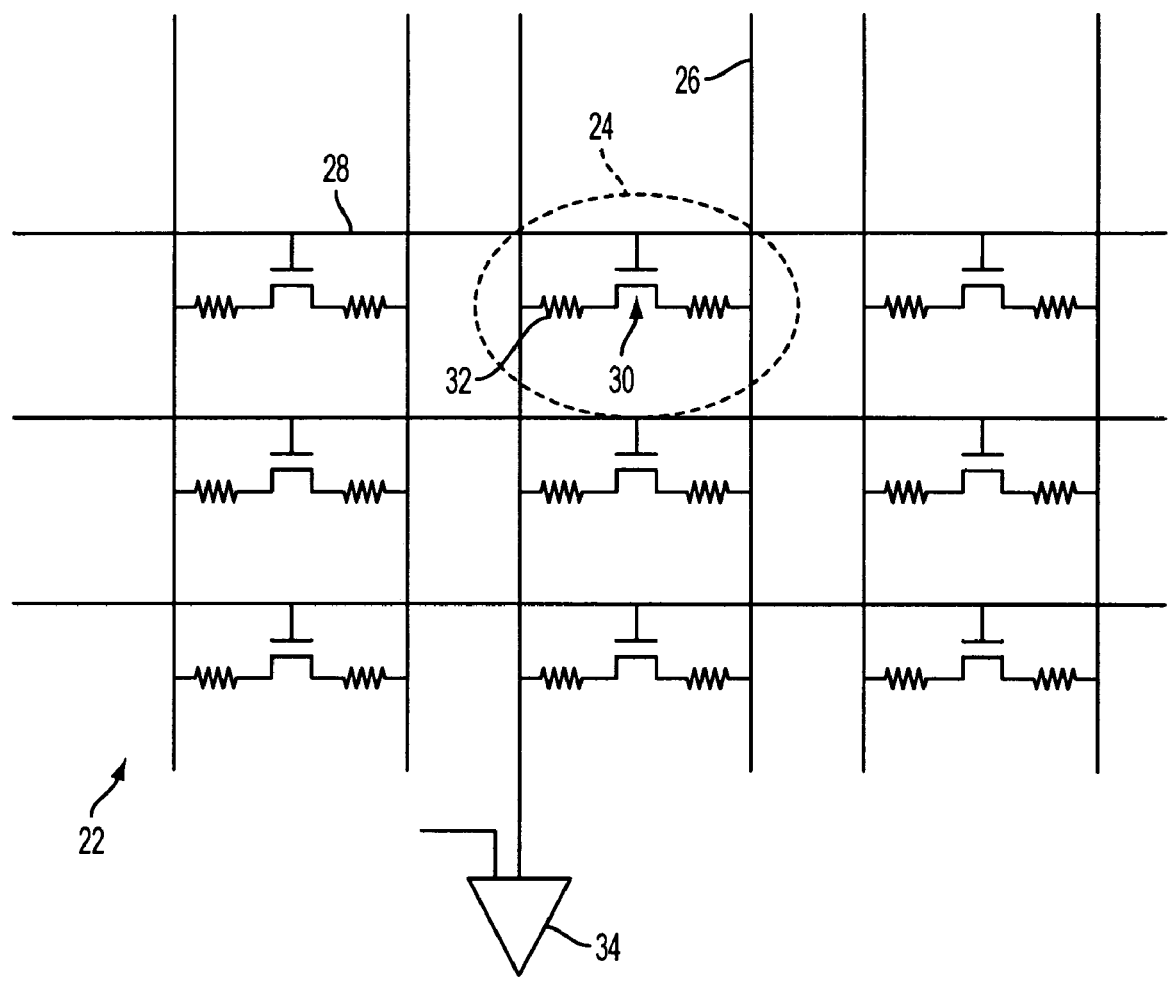
FIG. 2a is an illustration of a portion of an exemplary memory array architecture in accordance with an embodiment of the invention.

Now referring to the drawings, where like reference numbers designate like components of the invention, FIG. 2a shows a portion of a memory array 22 having a memory array architecture in accordance with an exemplary embodiment of the invention. As discussed in the preceding paragraph, the array 22 has memory cells 32, which are grouped into 1T-2nCell blocks 24. "1T-2nCell" indicates that there is an even number (2n) of memory cells 32 per transistor 30 for each block 24, where n memory cells 32 are on each side of the transistor 30. Each memory cell 32 is electrically coupled to a respective bit line 26 and each transistor 30 is electrically coupled to a respective word line 28. The bit lines 26 are electrically coupled to sense circuitry 34. Thus, FIG. 2a illustrates a 1T-2Cell architecture, in accordance with an embodiment of the invention.

Memory cells 32 of the invention can be MRAM, PCRAM, polymer-based, phase-changing chalcogenide-based, and other non-volatile type memory cells. Such memory cells 32 can be fabricated as is known in the art. Interconnect lines such as word lines and bit lines can be of materials and can be fabricated as is known in the art. Likewise, transistors used in the invention can be fabricated by processes and with materials as is known in the art.

Figure 2B:
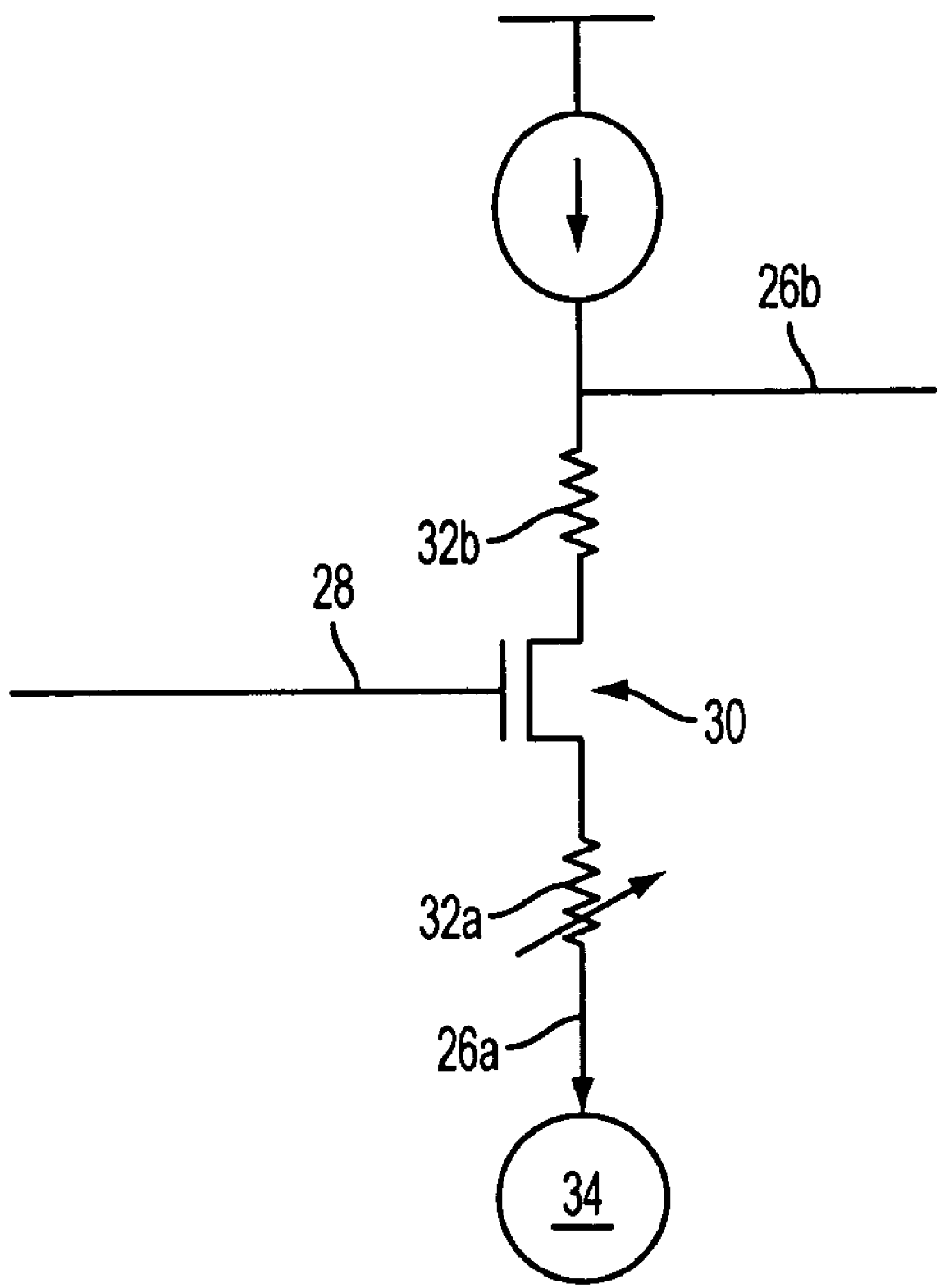
FIG. 2b is a schematic representation of a memory array circuit in accordance with the invention.

Now referring to FIG. 2b, a memory cell 32a can be addressed for reading by grounding the bit line 26a to which it is electrically coupled. Current is forced on a second bit line 26b electrically coupled to a (second) memory cell 32b on the opposite side of the transistor 30 within the memory cell block 24. A suitable (e.g., threshold) voltage is applied to the gate of the transistor 30 to activate the transistor 30. If the memory array 22 (see FIG. 2a) is an MRAM array, the addressed memory cell 32a can be read by changing the resistance state of the cell 32a, as is known in the art, and measuring the resistance change with sensing circuitry 34 electrically coupled to the bit line 26a. Various sensing circuits 34 can be applied as appropriate depending on the specific memory type (e.g., MRAM, PCRAM, polymer memory, chalcogenide memory, or others) of the array 22.

Figure 3:
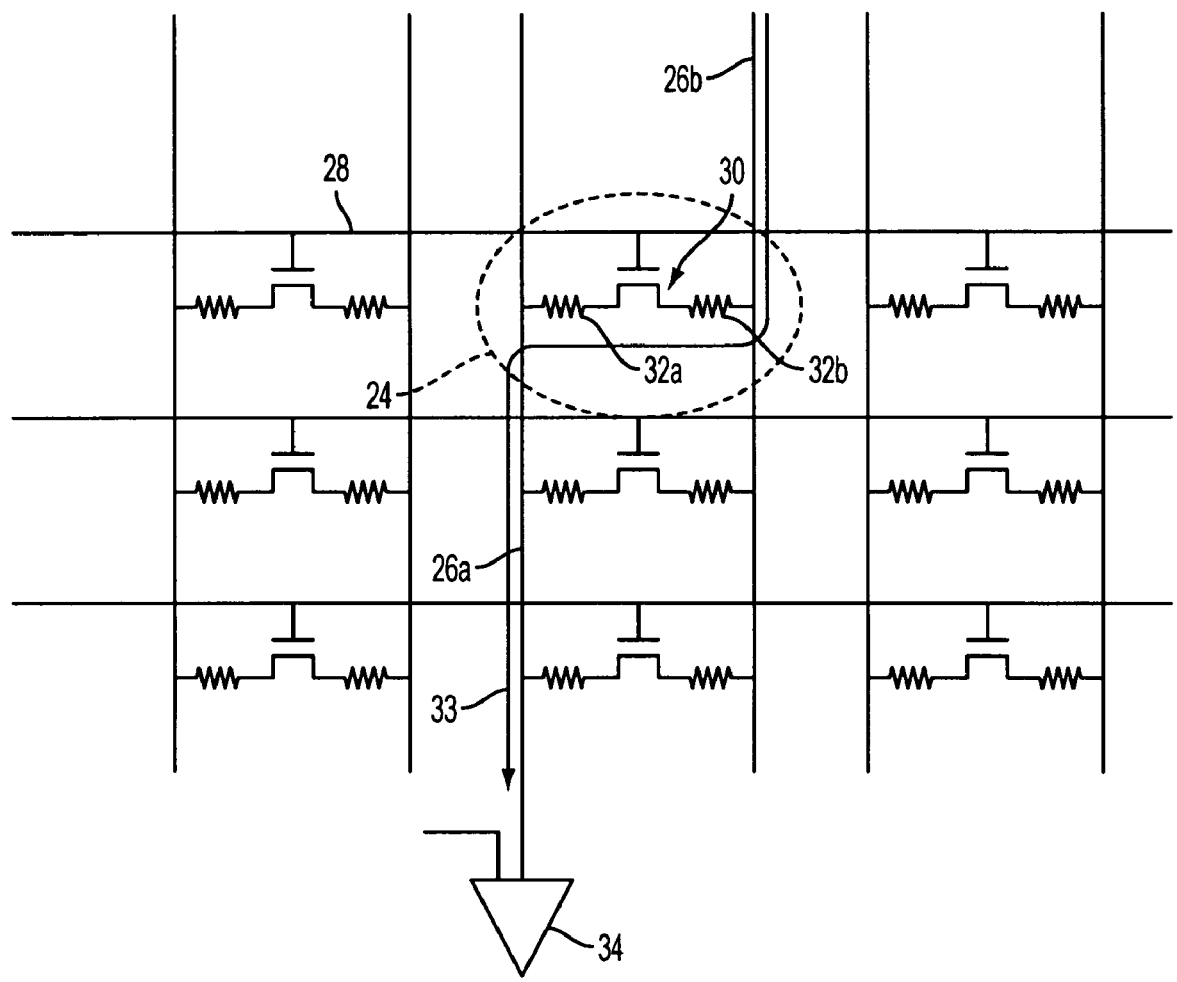
FIG. 3 is an illustration of the memory array architecture of FIGS. 2a and 2b during a read operation.

The addressing and reading operation is also shown in FIG. 3, which depicts an array 22 like that of FIG. 2a. In an architecture such as that shown in FIG. 3 (i.e., 1T-2Cell), there is no sneak path route available to the read circuit because the read circuit does not include any parasitic pathways. Instead, as shown by the arrow 33, current passes directly from the second bit line 26b through the second memory cell 32b, transistor 30, and addressed memory cell 32a, to the first bit line 26a and to the sensing circuit 34. The illustrated architecture would have a relatively large margin of resistivity difference in memory resistivity states. However, it may be desirable to have a denser memory array 22 than would be provided in the illustrated 1T-2Cell architecture (i.e., 1T-2nCell, where n is 1). In such a case, it is also possible to have more than two memory cells 32 (i.e., n>1) on either side of the transistor 30 of the memory cell block 24.

Figure 4A:
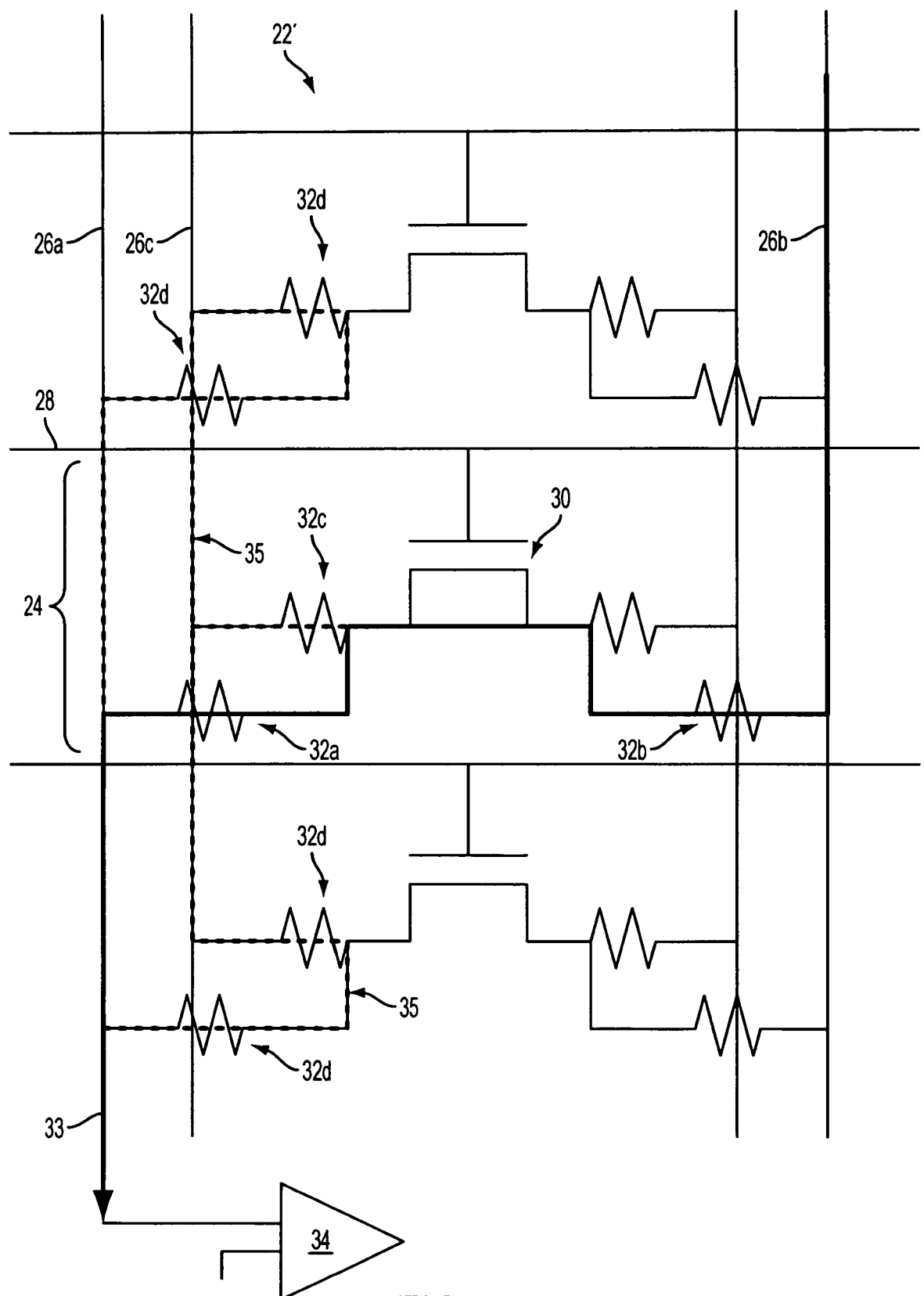
FIG. 4a is an illustration of a portion of an exemplary memory array architecture in accordance with the invention.

Now referring to FIG. 4a, a memory array 22' is shown where more than two memory cells are electrically coupled to either side of the transistor 30 of the memory cell blocks 24. The illustrated array 22' has four memory cells 32 per transistor 30 in a 1T-2nCell architecture, where n is 2 (i.e., 1T-4Cell architecture). In the 1T-4Cell architecture, a specific sneak path 35 (shown in dotted-lines) is created, which has a resistance that can be calculated, as discussed further below. As shown, the two sneak paths 35 combine through any memory cells 32c of the memory cell block 24 electrically coupled to the same side of the transistor 30 as the addressed cell 32a and through sneak memory cells 32d electrically coupled to the bit line 26a electrically coupled to the addressed cell 32a and through any bit line(s) 26c electrically coupled to the memory cell(s) 32c.

Figure 4B:
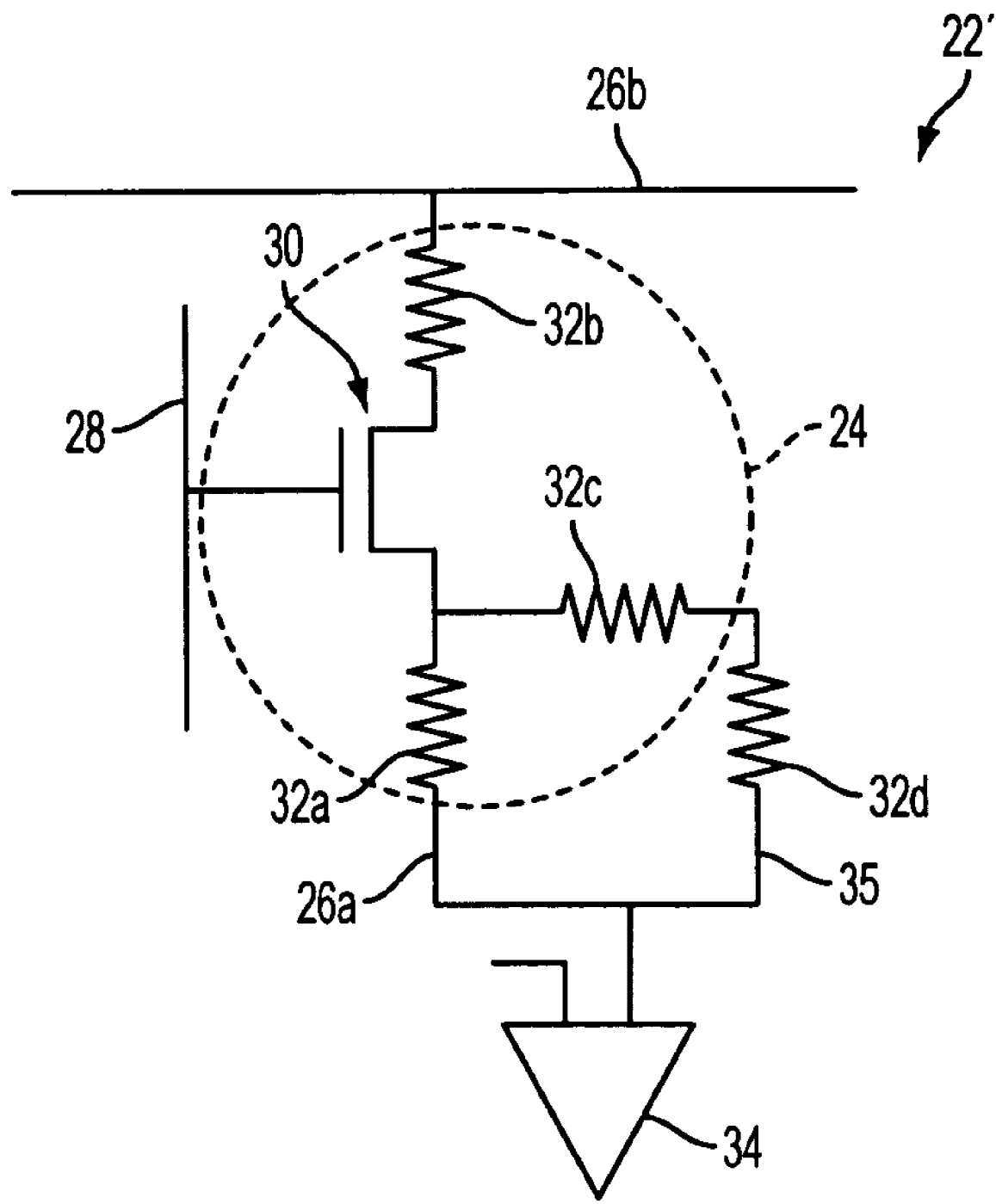

FIG. 4b shows a schematic circuit illustration of an addressed memory cell 32a in a 1T-2nCell architecture, where n can be any even number. The schematic circuit of FIG. 4b can be representational of the circuits of FIGS. 3 and 4a. As shown, the circuit includes bit line 26b, memory cell 32b, transistor 30, the addressed memory cell 32a, and a defined sneak path 35 through memory cells 32c and 32d. The sneak path 35 is in parallel with the addressed memory cell 32a. The illustrated circuit is completed at the sensing circuitry 34. The sneak path 35 is defined by $R/(n-1)$ at memory cell(s) 32c and $R/(m(n-1))$ at memory cell(s) 32d. R is the combined resistance of the individual memory cells 32c and 32d; n is the number of memory cells 32c of the memory cell block 24 on the same side of the transistor 30 as the addressed memory cell 32a; and m is the total number of rows (equivalent to the number of word lines 28). Therefore, the resistance of the sneak path 35 can be calculated as:

$$R\text{sneak}=[R/(n-1)]+[R/(m(n-1))] \quad (5)$$

This formula can be factored into a read operation. As shown by formula (5), the resistance of the sneak path of the array architecture of the invention can be exponentially greater than that of a comparable cross-point array architecture as exemplified by formulas (1)–(4) above.

Figure 5:
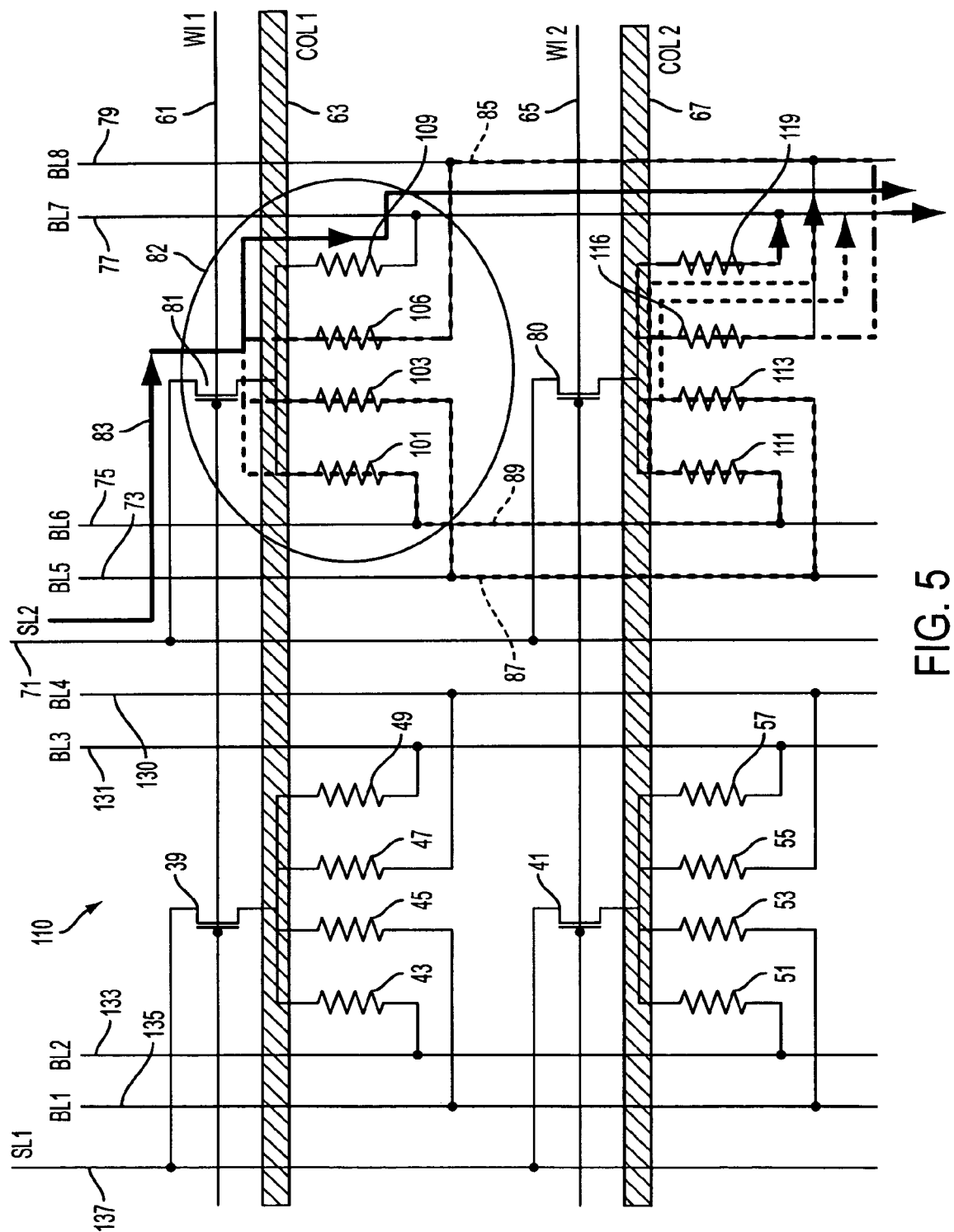
FIG. 5 is an illustration of a portion of an exemplary memory array architecture in accordance with another exemplary embodiment of the invention.

FIG. 5 shows an exemplary portion of a memory device 110 constructed according to another aspect of the invention. The device, which illustratively is an MRAM array, includes grouped pluralities of resistive memory cells, each having a first terminal and a second terminal. In the FIG. 5 example, memory cells 43, 45, 47, 49 are in a first group. Memory cells 101, 103, 106, and 109 are in a second group. Memory cells 51, 53, 55 and 57 are in a third group. Memory cells 111, 113, 116 and 119 are in a fourth group.

The resistive memory cells in each group have their first terminals coupled to one terminal of a select transistor. The group of memory cells and the select transistor comprising a memory block in accordance with the illustrated embodiment. For example, the first group is coupled to select transistor 39 forming a first memory block, the second group is coupled to select transistor 81 forming a second memory block, the third group is coupled to select transistor 41 forming a third memory block and the fourth group is coupled to select transistor 80 forming a fourth memory block. Each select transistor's gate is coupled to a word line. For example, in FIG. 5, the gates for select transistor 39 and select transistor 81 are coupled to word line WL1 (61); the gates for select transistor 41 and select transistor 80 are coupled to word line WL2 (65). The other terminal of the select transistors are coupled to a sense line. In FIG. 5, sense line SL1 (137) is coupled to the other terminal of select transistor 39 and 41; sense line SL2 (71) is coupled to the other terminal of select transistors 81, 80.

The second terminals of the memory cells are coupled to bit lines. In FIG. 5, group one memory cells 43, 45, 47, 49 are respectively coupled to bit lines BL2 133, BL1 135, BL4 130 and BL3 131. Group two's memory cells 101, 103, 106, 109 are respectively coupled to bit lines BL6 75, BL5 73, BL8 79 and BL7 77. Group three's memory cells are respectively coupled to bit lines BL2 133, BL1 135, BL4

130 and BL3 131. Group four's memory cells are respectively coupled to bit lines BL6 75, BL5 73, BL8 79 and BL7 77.

Figure 1A:
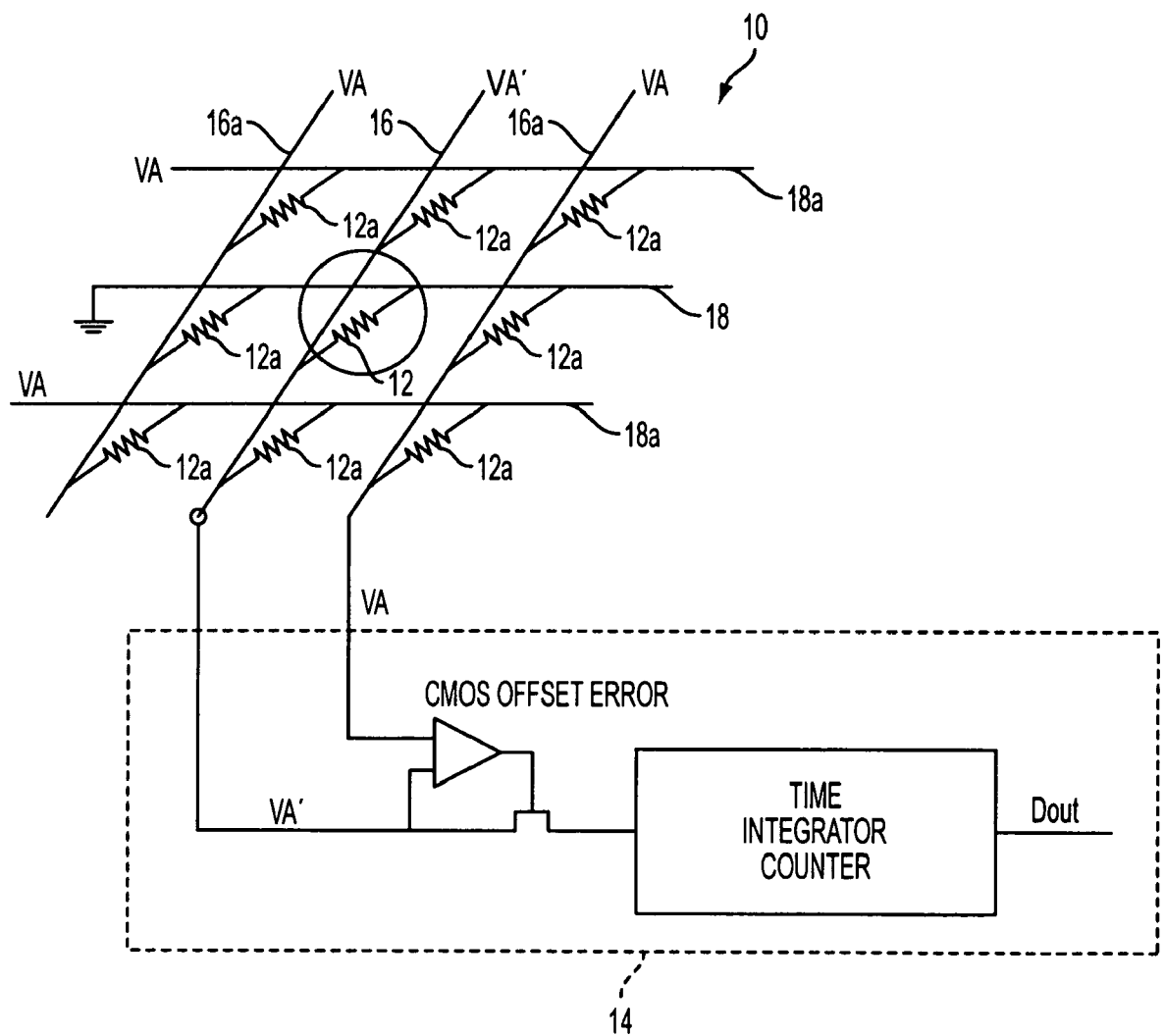
FIG. 1a is an illustration of a cross-point memory array of the prior art.
Figure 6:
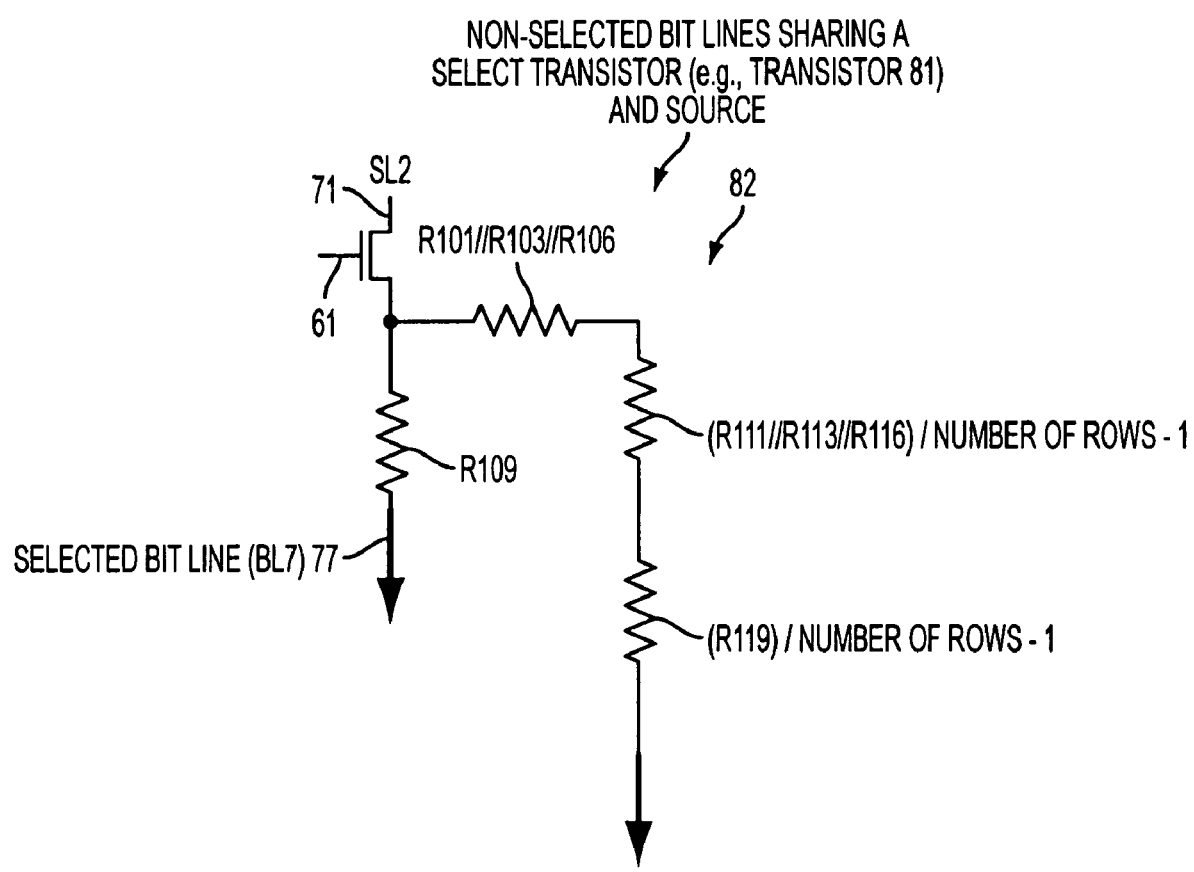
FIG. 6 is a schematic representation of an equivalent circuit of the FIG. 5 embodiment.

An exemplary sneak path in one mode of operation of the FIG. 5 resistive memory array is now described. For example, in the case where the MRAM resistance cell 109 is selected to be sensed, a current is injected from the sense amplifier through transistor 81, through the memory cell 109, to the grounded bit line BL7. The value of this current is evaluated by the sense amplifier, and a logic state is determined. However, as shown in FIG. 5, three additional sneak paths are also present through the other memory cells. The first sneak path 85 is through cell 106 and cell 116, the second sneak path 87 is through cells 103 and 113, and the third sneak path 89 is through cells 101 and 111. These three additional sneaks originate from cells 106, 103, and 101, respectively, and can generate additional sneak paths along the other cells (not shown in the figure) connected to bit lines BL5, BL6, BL7, and BL8. These sneak paths reduce the resistivity of the sensed resistive cell 109. This reduction in resistance is substantially reduced, however, when compared with the traditional cross matrix array approach (FIG. 1a). FIG. 6 shows the equivalent circuit diagram for the FIG. 5 resistive memory device. The equivalent sneak resistance Rsneak seen from the source of the select transistor is:

$$R\text{sneak} = ((R101 // R103 // R106) + (R111 // R113 // R116) / (r-1) + (R119)/(r-1)), \quad (6)$$

where r is the number of rows or word lines.

With large arrays where the number of rows are much greater than 1000, the last two resistance terms of equation (6) are very small. Thus, the equivalent sneak resistance Rsneak will be approximately equal to:

$$R\text{sneak} = ((R101 // R103 // R106) \sim R/3 \text{ for four cells per select transistor} \quad (7)$$

$$R\text{sneak} = \sim R/2 \text{ for three cells per select transistor,} \quad (8)$$

where R is the average memory cell resistance.

Figure 1B:
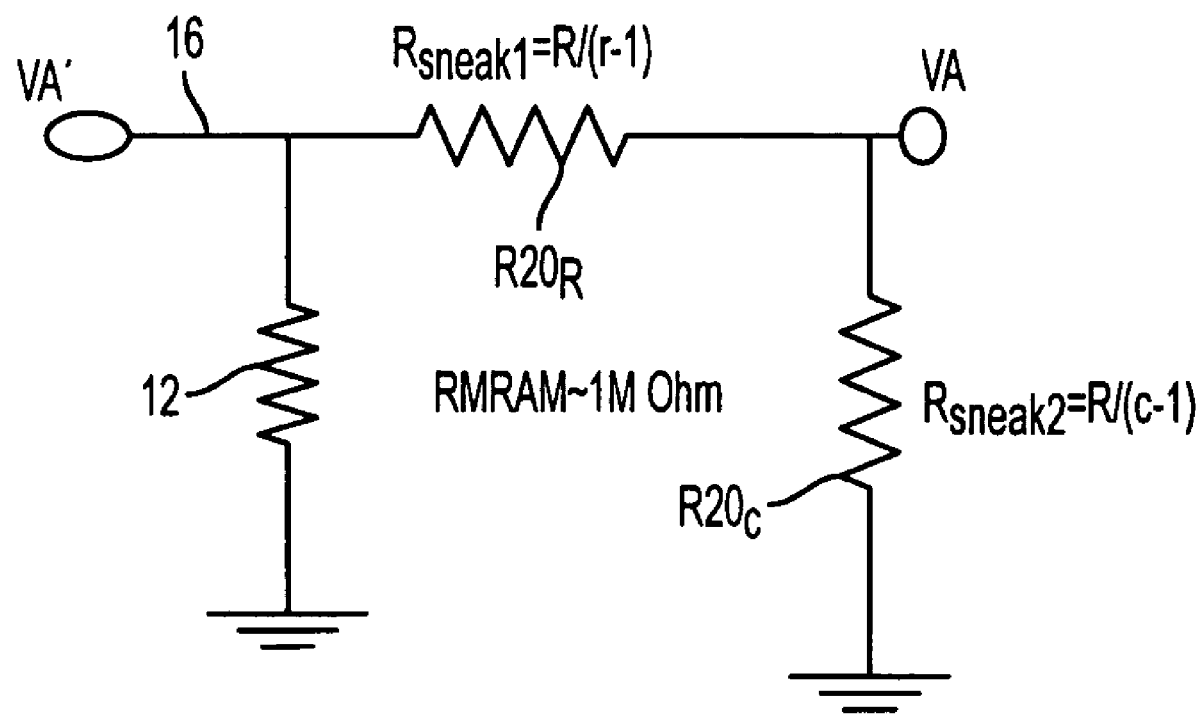

This sneak path resistance Rsneak is independent of the number of rows in the array as compared to the traditional cross-matrix array sneak path resistance described above with respect to FIGS. 1a and 1b. Therefore, sensing the resistance of the selected resistive memory cell with the illustrated architecture is easier to perform, but less immune to noise and transistor mismatching and threshold offsets (since the sneak path is not distributed through out the array). Without using equal potential sensing techniques a 20% total resistance change between the high and low resistance states reduces the change to 4.3%. In comparison, a cross matrix array with 1000 rows needs to use equal potential sensing with approximately 1 mv offset between VA and VA' to reach to the 4.3% change.

It is also possible to use equal potential technique with the FIG. 5 architecture to further reduce or almost eliminate the impact of the R/3 sneak path. The sensed resistance in the FIG. 5 architecture (i.e., 4 cells per select transistor) is extracted from the FIG. 6 equivalent circuit to be:

$$R\text{sense} = VA'/(((VA'-VA)/(R/3)) + VA'/R), \text{ or} \quad (9)$$

$$R\text{sense} = R/((3(VA'-VA)/VA') + 1), \quad (10)$$

with the assumptions: VA'=500 mv voltage applied on sense line SL2 and the sneak paths resistances along the bit line are assumed to be zero ohms since the number of rows in the array are usually very large.

Since the sneak path resistance is much larger in this example, a small offset of the equal potential applied to the unselected bit lines will not generate large errors in the measurement. For example, using four memory cells per transistor as shown in FIG. 5, the sneak path resistance value for an average 1 Mohm resistive cell is 333 Kohm if the potential of the selected bit line is applied to the unselected bit lines and it is assumed that there is an offset of 5 mv difference between the selected and unselected bit lines, the 20% total resistance change between the high and low resistance states reduces to 19.3% compared to 1.5% with the cross matrix array architecture under the same conditions.

Figure 7:
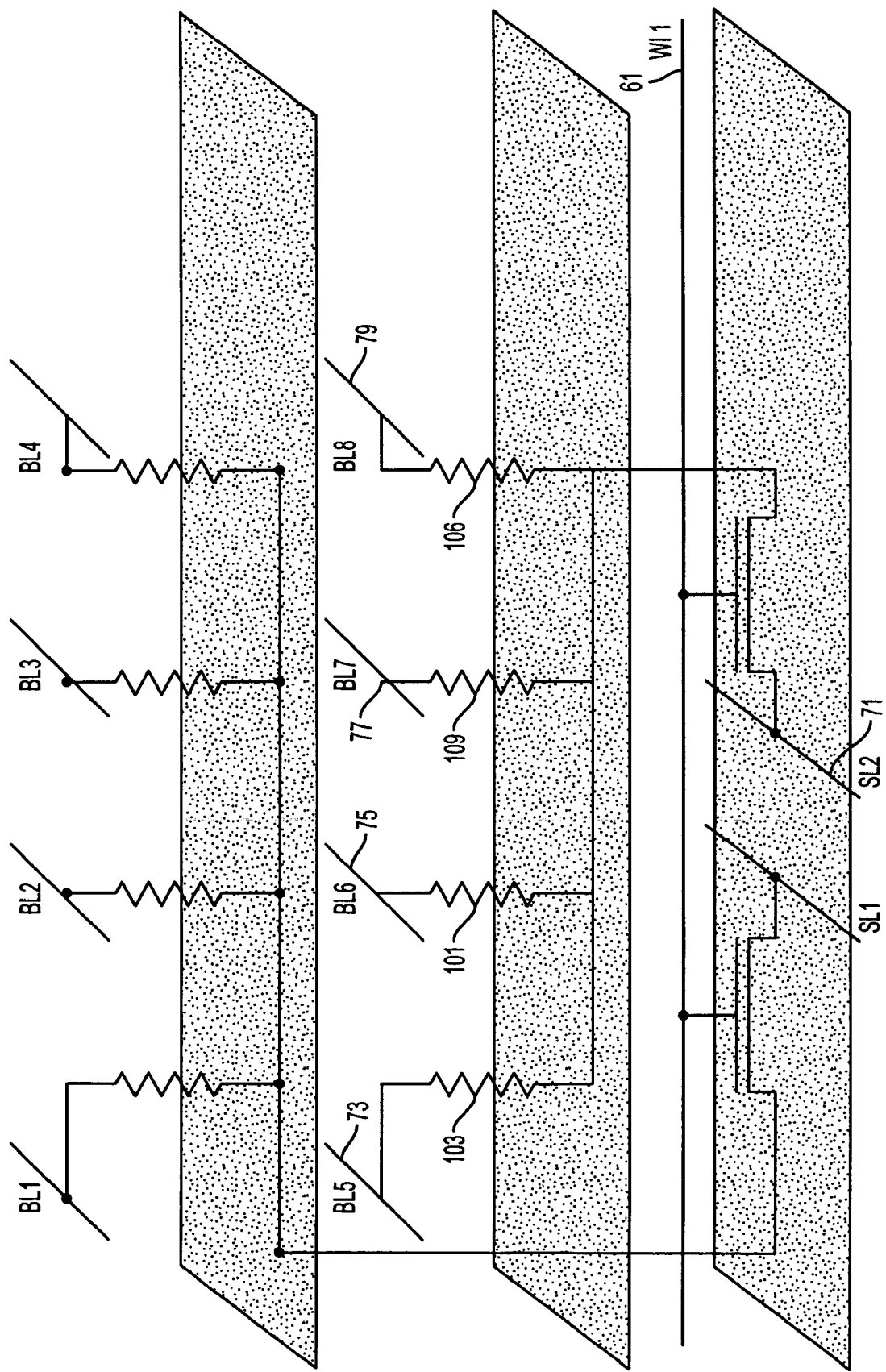
FIG. 7 is an exemplary cell layout for the exemplary memory array illustrated in FIG. 5.
Figure 8:
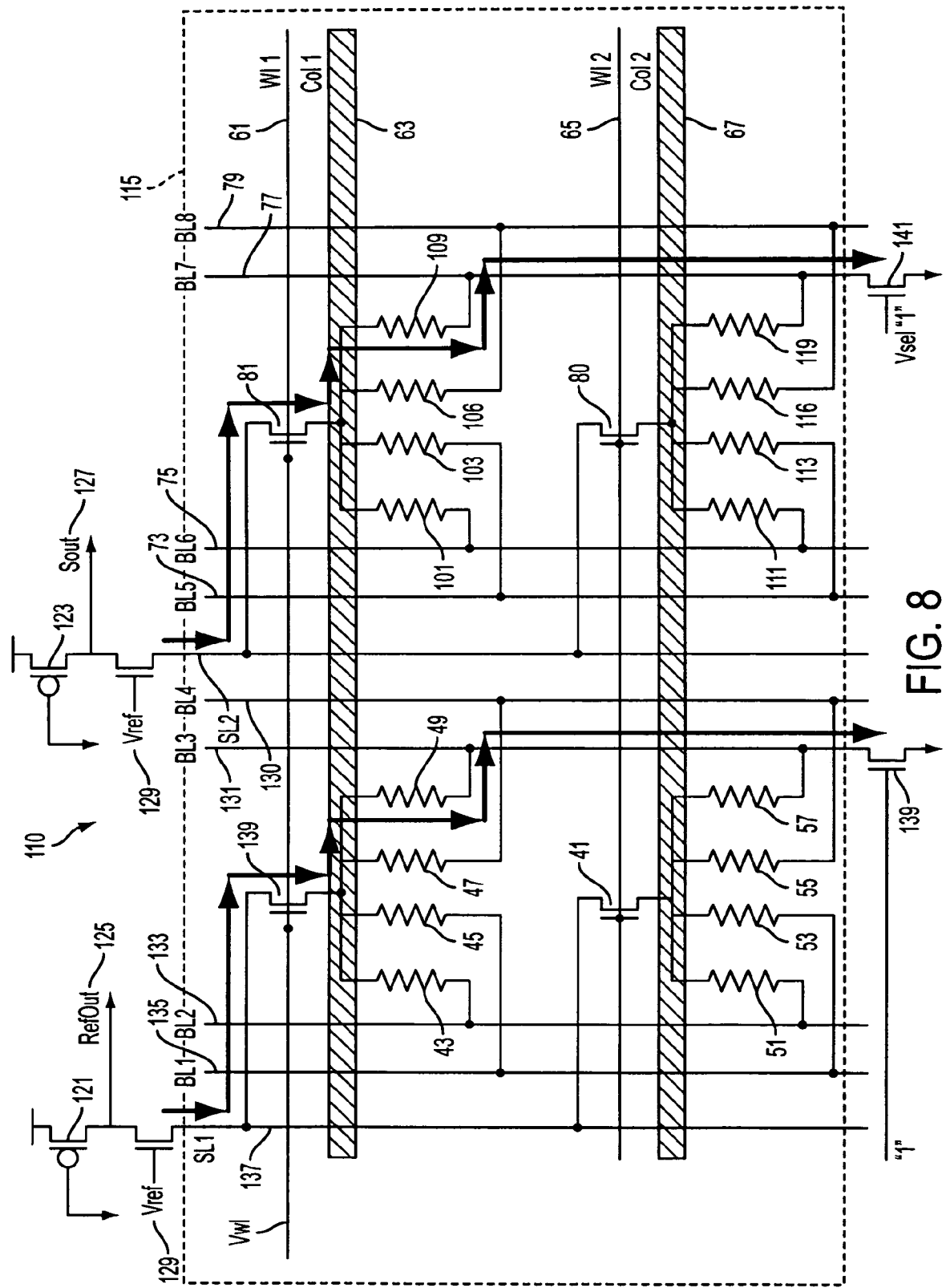
FIG. 8 illustrates the exemplary memory array of FIG. 5 during a read operation.

FIG. 7 illustrates an exemplary physical cell layout of the FIG. 5 exemplary embodiment of the invention. FIG. 8 shows a simplified sensing circuit that could be used to sense the resistance change of any of the cells of the array 110. Cascode transistors 129 have their gates connected to a reference voltage Vref and are used to clamp bit lines to a safe or recommended optimum read voltage (e.g., approximately 200 mv to 600 mv) and to isolate large sense line capacitances from the output Sout. FIG. 8 illustrates one cascode transistor 129 connected to the second sense line SL2, which will provide isolation for bit line BL7 in the following example. PMOS transistors 121 act as loads to detect current and generate a voltage at their respective drain terminals, which are the output Sout. The gates of the PMOS transistors could also be connected to a reference voltage to limit the current flow through the memory cells and optimize the sensing operation.

Figure 9A:
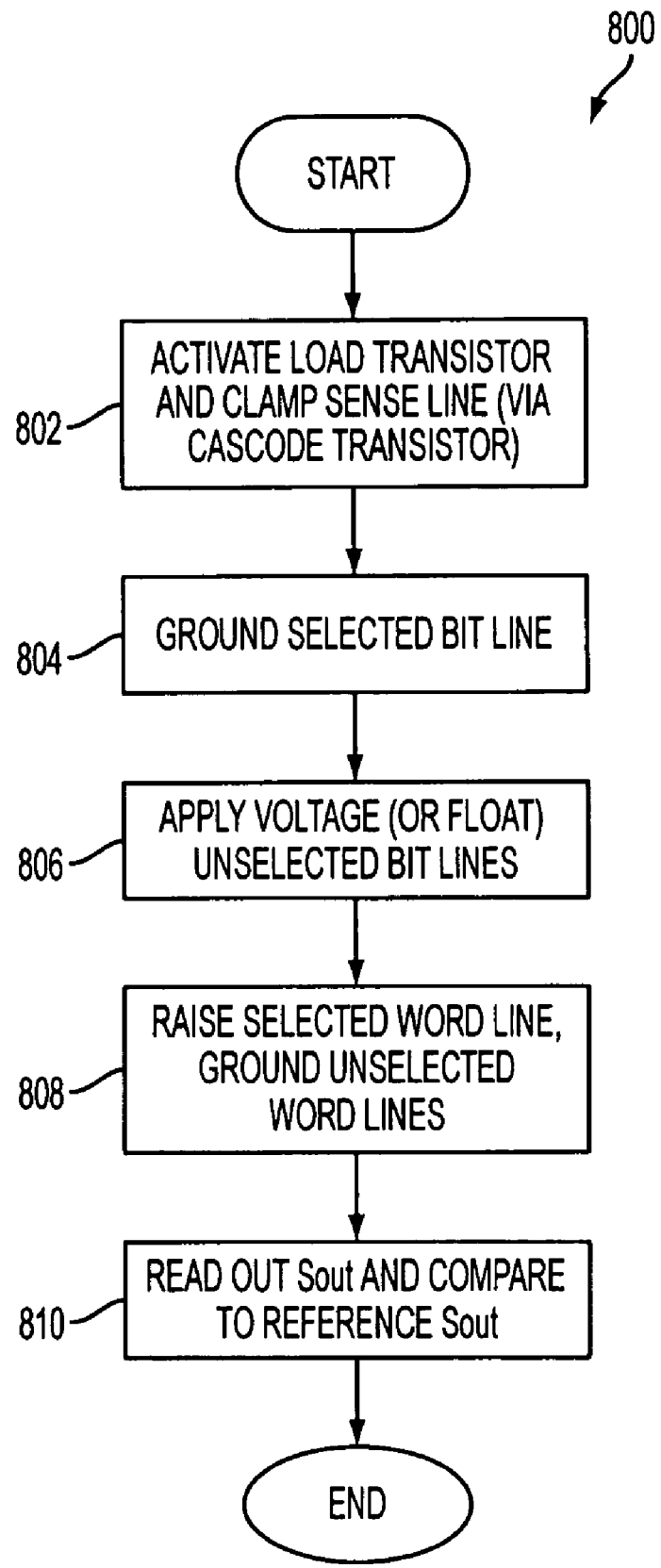
FIGS. 9a–9b are flowcharts illustrating exemplary processing performed in accordance with embodiments of the invention.

Referring to FIGS. 8 and 9a, a typical sensing operation 800 of the memory cells could be performed as follows. Initially, a ground potential or a reference voltage may be applied to the gate of the PMOS transistor 121 to activate the transistor 121 (step 802). Also during step 802, the reference voltage Vref is applied to the cascode transistor 129 to clamp the second sense line SL2. The selected bit line BL 7 is grounded (step 804). Then, the device is using an equal potential sensing technique, approximately 500 mv is applied to the unselected bit lines BL5, BL6, BL8 (step 806). Otherwise the unselected bit lines BL5, BL6, BL 8 could left floating. At step 808, The selected word line WL1 61 is raised while all other unselected word lines are grounded. Sout is read by the subsequent stages of the sense amplifier and is compared to another reference cell generated Sout voltage to determine the value of Sout.

Figure 9B:
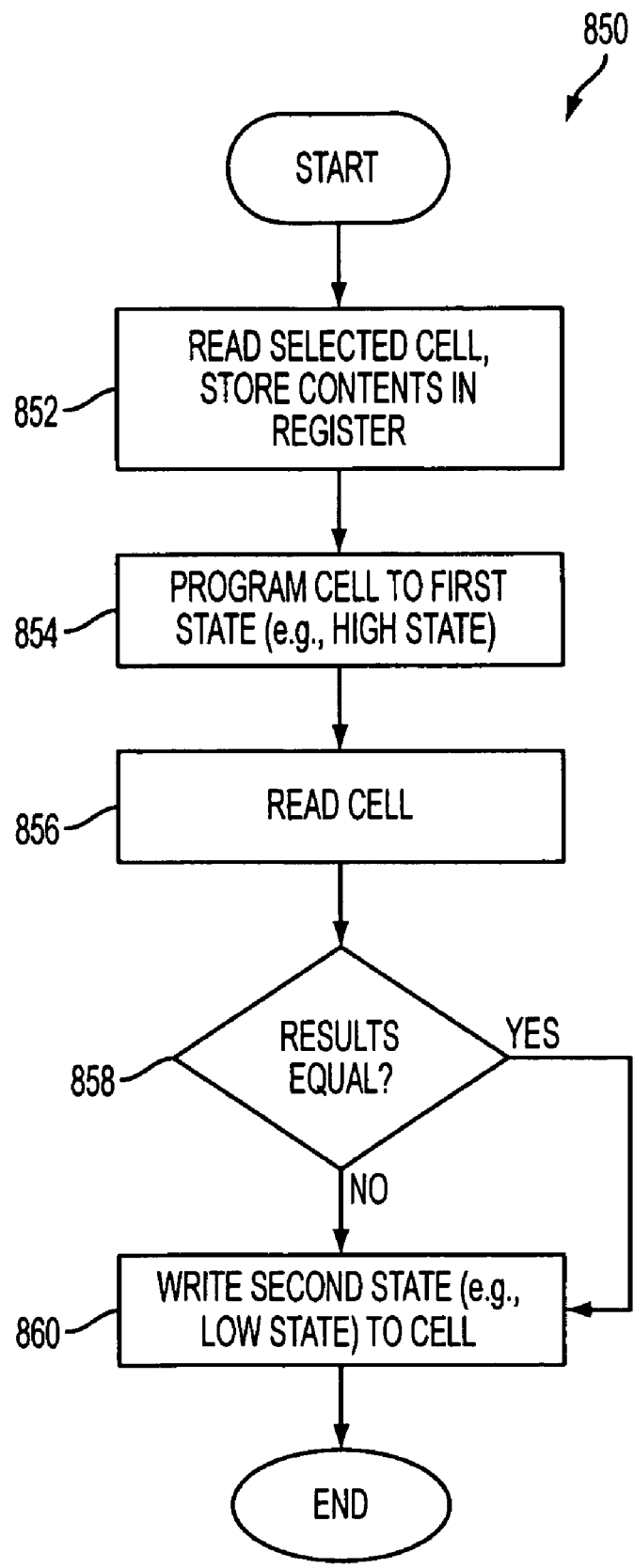

Many other existing and new sensing schemes could be utilized to sense the current through the selected memory cells with the architecture illustrated in FIG. 8. Since the sneak path in this architecture is not hindering the memory cells resistance, it is possible to use faster sensing schemes. In the cross-matrix array architecture, read, write to a known state, read, write/modify sequence is proposed. The flow for this sensing is illustrated in FIG. 9b. The process 850 beings by reading the selected cell and storing the sensed voltage or current to a register or capacitor (step 852). Next, a known state is written into the memory cell (e.g., program the cell to a high resistance state)(step 854). The selected cell is read again (step 856). At step 858, a comparison of the stored result of step 852 and the result of step 856 is made. If there is no change, it is determined that the cell was already in the known (e.g., high) resistance state and the sensing process 850 is complete. If, however, there is a change, it is determined that the cell was in the other (e.g., low) resistance state. As such, the other resistance state (e.g., low) is written back into the cell (step 860) and the method 850 completes.

This process 850 is used in cross matrix arrays to overcome the sneak paths impact on the sensing operation. By altering the state of the selected cell the state of the cell is determined. With the new architecture since the sneak path resistance is much larger and does not have as much impact to the sensing current sensing algorithms do not have to alter the state of the memory cell to determine the resistance state. This will speed up the sensing, simplify the sensing flow and provide more sensing margin for the logical states.

Figure 10:
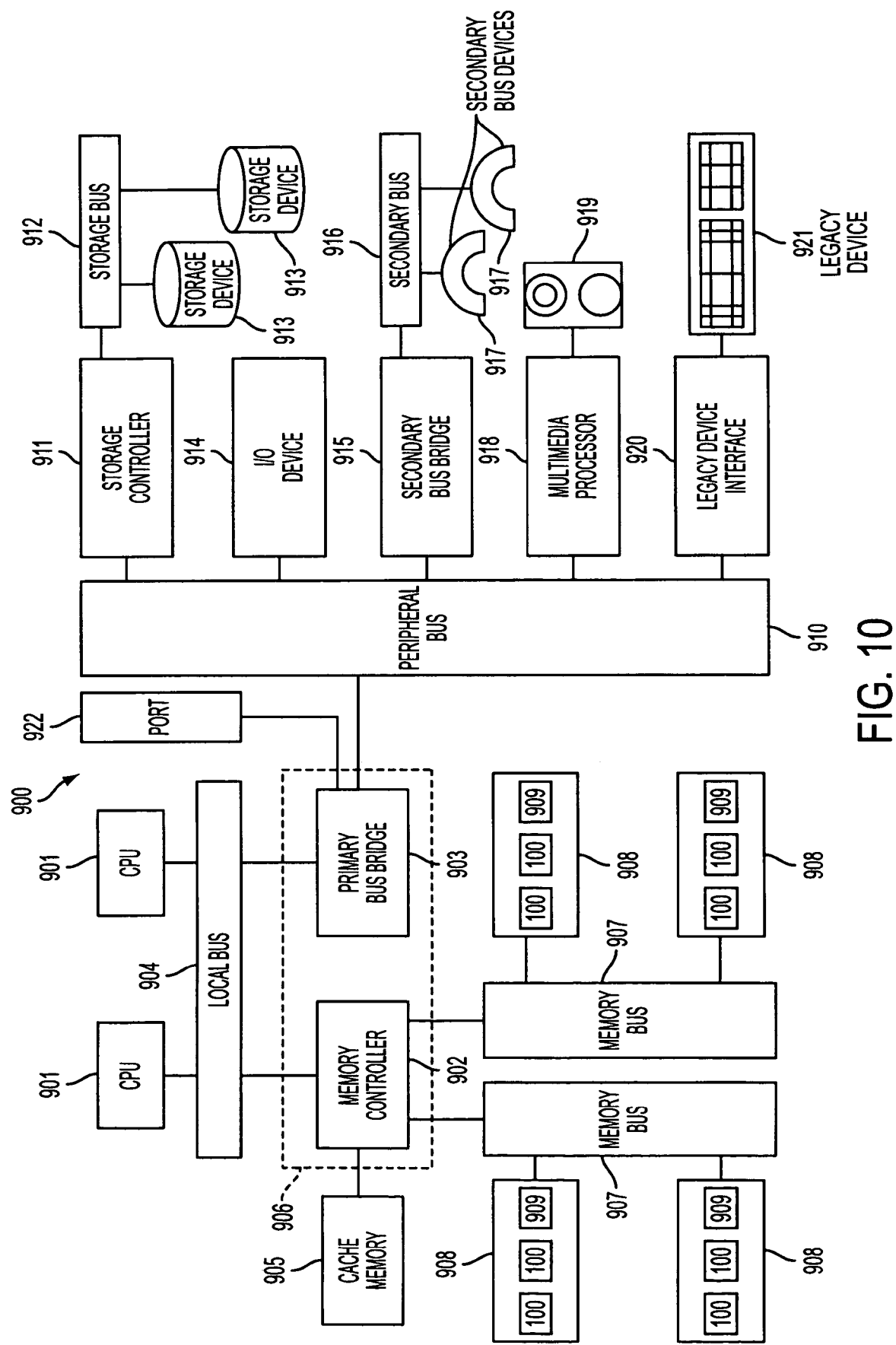
FIG. 10 is a block diagram representation of a processor-based system incorporating a memory device constructed in accordance with one of the exemplary embodiments of the invention.

FIG. 10 illustrates an exemplary processing system 900 which may utilize a memory device 100 having a memory array 22 (FIG. 2a), 22' (FIG. 4a), 110 (FIG. 5), in accordance with the invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus 907 accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge 915 may be a universal serial port (USB) controller used to couple USB devices 917 to the processing system 900. The multimedia processor 918 may be a sound card, a video capture card, or any other type of media interface, which may also be coupled to one additional devices such as speakers 919. The legacy device interface 920 is used to couple legacy devices 921, for example, older styled keyboards and mice, to the processing system 900.

The processing system 900 illustrated in FIG. 10 is only an exemplary processing system with which the invention may be used in a memory array. While FIG. 10 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The processes and devices described above are merely illustrative of but a few of the preferred methods and typical devices that could be used and produced in accordance with the invention. The above description and drawings illustrate embodiments, which achieve the objects, features, and advantages of the present invention. However, it is not intended that the present invention be strictly limited to the above-described and illustrated embodiments. Any modifications of the present invention that come within the spirit and scope of the following claims should be considered part of the present invention.

The invention claimed is:

1. A memory device comprising:
first, second and third plurality of conductors, each first conductor being a sense line, each second conductor being a word line and each third conductor being a bit line;
a plurality of select transistors each having a first, second and third terminal, said first terminal coupled to one of said first plurality of conductors and said second terminal coupled to one of said second plurality of conductors; and
a plurality of groups of memory cells, each of said memory cells having a first and second terminal, each said first terminal in each said group of memory cells being coupled to said third terminal of said select transistor, said second terminal of each memory cell being coupled to a respective one of said third plurality of conductors such that each cell in a group is coupled between its respective third conductor and the third terminal of the select transistor.

2. The memory device of claim 1, wherein each memory cell comprises a resistive memory element.

3. The memory device of claim 1, wherein each memory cell comprises a programmable conductance random access memory cell.

4. The memory device of claim 1, wherein each memory cell comprises a magnetoresistive random access memory cell.

5. The memory device of claim 1, wherein each memory cell comprises a resistive nonvolatile storage device.

6. The memory device of claim 1, wherein said first conductor is selectively coupled to a first voltage source, said second conductor is selectively coupled to a second voltage source and said third conductor is selectively coupled to a sense amplifier.

7. A memory device comprising:
first, second and third of conductors, each first conductor being a sense line, each second conductor being a word line and each third conductor being a bit line;
a plurality of select transistors each having a first, second and third terminal, said first terminal coupled to one said first plurality of conductors and said second terminal coupled to one of said second plurality of conductors;
a plurality of groups of memory cells, each of said memory cells having a first and second terminal, each said first terminal in each said group of memory cells being coupled to said third terminal of said select transistor, said second terminal being coupled to one of said third plurality of conductors; and
a respective sensing circuit electrically coupled to each sense line, wherein each sensing circuit comprises:
a cascode transistor having a terminal connected to the sense line and a gate terminal connected to a reference voltage; and
a load transistor connected between the cascode transistor and a voltage source.

8. A processing system, comprising:
a processor; and
a memory device coupled with said processor, said memory device comprising:
first, second and third plurality of conductors, each first conductor being a sense line, each second conductor being a word line and each third conductor being a bit line;
a plurality of select transistors each having a first, second and third terminal, said first terminal coupled to one of said first plurality of conductors and said second terminal coupled to one of said second plurality of conductors; and
a plurality of groups of memory cells, each of said memory cells having a first and second terminal, each said first terminal in each said group of memory cells being coupled to said third terminal of said select transistor, said second terminal of each memory cell being coupled to a respective one of said third plurality of conductors such that each cell in a group is coupled between its respective third conductor and the third terminal of the select transistor.

9. The system of claim 8, wherein each memory cell comprises a resistive memory element.

10. The system of claim 8, wherein each memory cell comprises a programmable conductance random access memory cell.

11. The system of claim 8, wherein each memory cell comprises a magnetoresistive random access memory cell.

12. The system of claim 8, wherein each memory cell comprises a resistive nonvolatile storage device.

13. The system of claim 8, wherein said first conductor is selectively coupled to a first voltage source, said second conductor is selectively coupled to a second voltage source and said third conductor is selectively coupled to a sense amplifier.

14. A processing system, comprising:
a processor; and
a memory device coupled with said processor, said memory device comprising:
first, second and third plurality of conductors, each first conductor being a sense line, each second conductor being a word line and each third conductor being a bit line;
a plurality of select transistors each having a first, second and third terminal, said first terminal coupled to one of said first plurality of conductors and said second terminal coupled to one of said second plurality of conductors;
a plurality of groups of memory cells, each of said memory cells having a first and second terminal, each said first terminal in each said group of memory cells being coupled to said third terminal of said select transistor, said second terminal being coupled to one of said third plurality of conductors; and
a respective sensing circuit electrically coupled to sense line, wherein each sensing circuit comprises:
a cascode transistor having a terminal connected to the sense line and a gate terminal connected to a reference voltage; and
a load transistor connected between the cascode transistor and a voltage source.

15. A method of reading or writing to a memory element in a memory array, comprising:
forming an electrical circuit between an addressed memory cell and at least three other memory cells, said circuit comprising a transistor electrically coupling said addressed memory cell and the other memory cells to a sense line; and
sensing a resistance state of the addressed cell through the circuit, wherein the addressed memory cell is in electrical communication with a first bit line, and the other memory cells are in electrical communication with respective second, third and fourth bit lines and said transistor, and said method senses the resistance state through a resistance path comprising the sense line, transistor, addressed cell and first bit line.

16. A method of reading or writing to a memory element in memory array, comprising:
forming an electrical circuit between and addressed memory cell and at least three other memory cells, said circuit comprising a transistor electrically coupling said addressed memory cell and the other memory cells to sense line;
sensing a resistance state of the addressed cell through the circuit, wherein the addressed memory cell is electrical communication with a first bit line, and the other memory cells are in electrical communication with respective second, third and fourth bit lines, and sais method senses the resistance state through a resistance path comprising the sense line, transistor, addressed cell and first bit line;
reading a first value from the addressed cell;
writing a second value into the addressed cell;
reading the second value from the addressed cell and determining it the first value is the same as the second value.

17. The method of claim 16 further comprising the act of storing the first value in the addressed cell if the first value is not the same as the second value.

18. A method of reading or writing to a memory element in a memory array, comprising:
forming an electrical circuit between an addressed memory cell and at least three other memory cells, said circuit comprising a transistor electrically coupling said addressed memory cell and the other memory cells to a sense line;

sensing a resistance state of the addressed cell through the circuit, wherein the addressed memory cell is in electrical communication with a first bit line, and the other memory cells are in electrical communication with respective second, third and fourth bit lines, and said method senses the resistance state through a resistance path comprising the sense line, transistor, addressed cell and first bit line; and coupling a cascode transistor to a first voltage source to limit a voltage on a bit line coupled to the addressed cell.

* * * * *

UNITED STATES PATENT AND TRADEMARK OFFICE
CERTIFICATE OF CORRECTION

| | | |
|---|---|---|
| PATENT NO. | : 7,286,378 B2 | Page 1 of 1 |
| APPLICATION NO. | : 10/873112 | |
| DATED | : October 23, 2007 | |
| INVENTOR(S) | : Hagop A. Nazarian | |

It is certified that error appears in the above-identified patent and that said Letters Patent is hereby corrected as shown below:

In column 11, line 7, in Claim 7, after "third" insert -- plurality --.

In column 11, line 11, in Claim 7, after "to one" insert -- of --.

In column 12, line 16, in Claim 14, after "to" insert -- each --.

In column 12, line 39, in Claim 16, after "in" insert -- a --.

In column 12, line 40, in Claim 16, delete "and" and insert -- an --, therefor.

In column 12, line 43, in Claim 16, after "to" insert -- a --.

In column 12, line 46, in Claim 16, after "is" insert -- in --.

In column 12, line 49, in Claim 16, delete "sais" and insert -- said --, therefor.

In column 12, line 55, in Claim 16, after "cell" insert -- ; --.

In column 12, line 56, in Claim 16, delete "it" and insert -- if --, therefor.

Signed and Sealed this

Twenty-fifth Day of December, 2007

JON W. DUDAS
*Director of the United States Patent and Trademark Office*